(12) United States Patent
Collins et al.

(10) Patent No.: US 12,046,568 B2
(45) Date of Patent: Jul. 23, 2024

(54) CAPACITOR DIE EMBEDDED IN PACKAGE SUBSTRATE FOR PROVIDING CAPACITANCE TO SURFACE MOUNTED DIE

(71) Applicant: Intel Corporation, Santa Clara, CA (US)

(72) Inventors: Andrew Collins, Chandler, AZ (US); Sujit Sharan, Chandler, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/214,742

(22) Filed: Jun. 27, 2023

(65) Prior Publication Data

US 2023/0343731 A1    Oct. 26, 2023

Related U.S. Application Data

(63) Continuation of application No. 17/518,504, filed on Nov. 3, 2021, now Pat. No. 11,728,294, which is a
(Continued)

(51) Int. Cl.
| | |
|---|---|
| *H01L 23/66* | (2006.01) |
| *H01L 21/48* | (2006.01) |
| *H01L 23/522* | (2006.01) |
| *H01L 23/528* | (2006.01) |
| *H01L 23/538* | (2006.01) |

(Continued)

(52) U.S. Cl.
CPC .......... *H01L 23/66* (2013.01); *H01L 21/4846* (2013.01); *H01L 23/5223* (2013.01); *H01L 23/5286* (2013.01); *H01L 23/5381* (2013.01); *H01L 23/5389* (2013.01); *H01L 25/16* (2013.01); *H01L 25/50* (2013.01); *H01L 23/481* (2013.01); *H01L 2223/6666* (2013.01); *H01L 2223/6672* (2013.01)

(58) Field of Classification Search
CPC . H01L 23/66; H01L 21/4846; H01L 23/5223; H01L 23/5286; H01L 23/5381; H01L 23/5389; H01L 25/16; H01L 25/50; H01L 23/481; H01L 24/16; H01L 24/19; H01L 24/20; H01L 24/25; H01L 23/5384; H01L 2924/1433; H01L 2924/19011; H01L 21/4857; H01L 21/486; H05K 1/185
See application file for complete search history.

(56) References Cited

U.S. PATENT DOCUMENTS

| | | | |
|---|---|---|---|
| 2009/0273884 A1* | 11/2009 | Shimizu | ................. H05K 1/162 216/6 |
| 2010/0327433 A1 | 12/2010 | Sweeney | |

(Continued)

*Primary Examiner* — Karen Kusumakar
*Assistant Examiner* — Adam S Bowen
(74) *Attorney, Agent, or Firm* — Schwabe, Williamson & Wyatt, P.C.

(57) ABSTRACT

A package substrate is disclosed. The package substrate includes a die package in the package substrate located at least partially underneath a location of a power delivery interface in a die that is coupled to the surface of the package substrate. Connection terminals are accessible on a surface of the die package to provide connection to the die that is coupled to the surface of the package substrate. Metal-insulator-metal layers inside the die package are coupled to the connection terminals.

20 Claims, 11 Drawing Sheets

Related U.S. Application Data continuation of application No. 15/942,092, filed on Mar. 30, 2018, now Pat. No. 11,195,805.

(51) Int. Cl.
*H01L 25/00* (2006.01)
*H01L 25/16* (2023.01)
*H01L 23/48* (2006.01)

(56) References Cited

U.S. PATENT DOCUMENTS

| | | | |
|---|---|---|---|
| 2012/0080222 A1 | 4/2012 | Kim | |
| 2015/0001717 A1* | 1/2015 | Karhade | H01L 24/17 257/741 |
| 2018/0190582 A1* | 7/2018 | Shih | H01L 21/6835 |

* cited by examiner

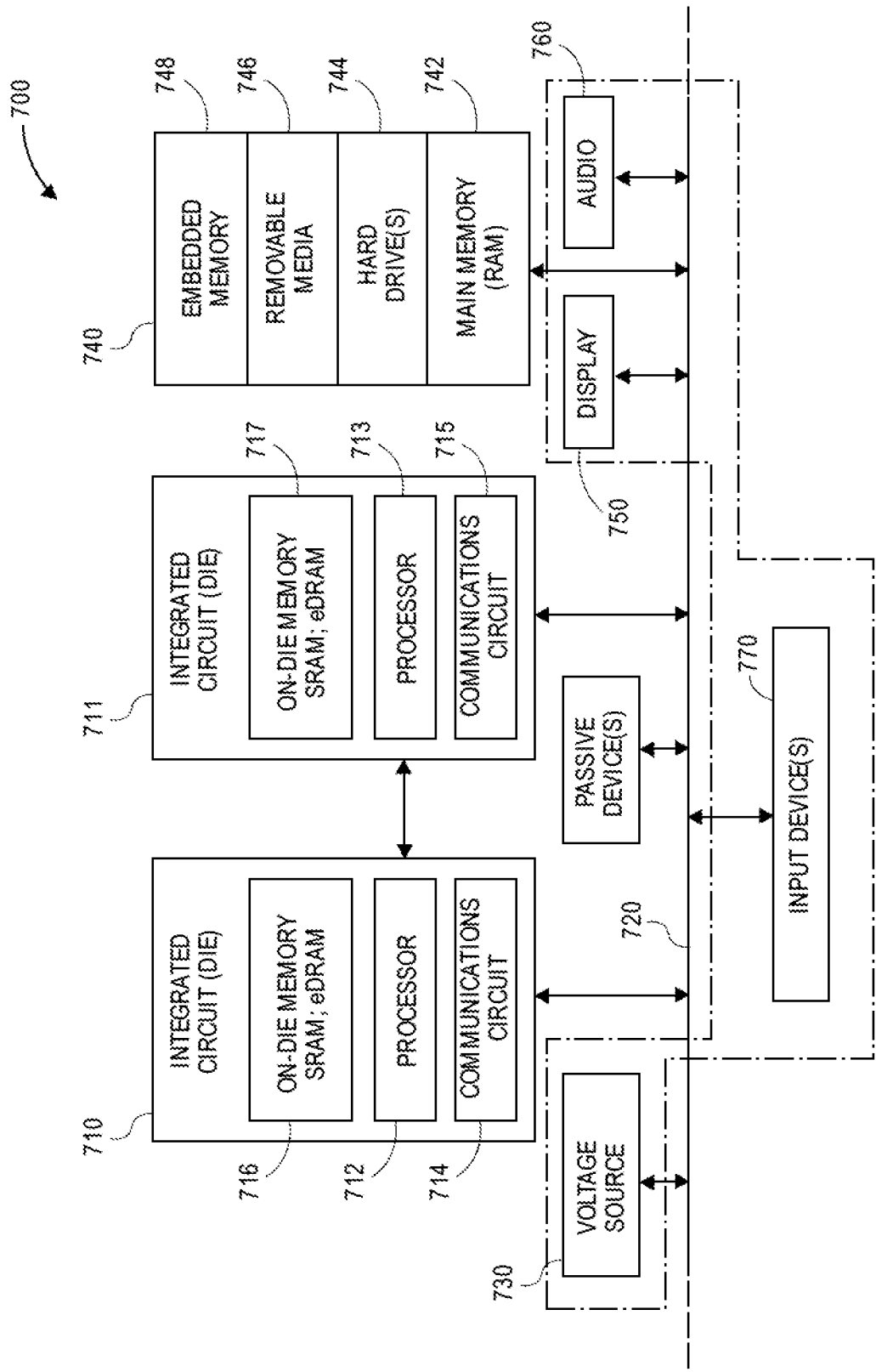

CAPACITOR DIE EMBEDDED IN PACKAGE SUBSTRATE FOR PROVIDING CAPACITANCE TO SURFACE MOUNTED DIE

CROSS-REFERENCE TO RELATED APPLICATIONS

This application is a continuation of U.S. patent application Ser. No. 17/518,504, filed Nov. 3, 2021, which is a continuation of U.S. patent application Ser. No. 15/942,092, filed Mar. 30, 2018, the entire contents of which is hereby incorporated by reference herein.

TECHNICAL FIELD

Embodiments of the disclosure pertain to providing decoupling capacitance to surface mounted dies and, in particular, to a capacitor die embedded in a packaged substrate for providing decoupling capacitance to a surface mounted die.

BACKGROUND

Decoupling in electronics involves the use of decoupling capacitors to decouple one part of an electrical network (circuit) from another. Noise caused by circuit elements in one part of the network is shunted through a capacitor, which reduces the effect of the noise on the rest of the circuit. An alternative name for decoupling capacitor is bypass capacitor as it is used to bypass the power supply or other high impedance component of a circuit.

The power delivery decoupling approach that is used determines the performance (including the amount of AC impedance and level of transient noise) of power rails for processor cores, graphics, and memory input/output (I/O) PHY blocks. Some on-die decoupling approaches that use metal-insulator-metal (MIM) capacitors have been shown to reduce high-frequency noise. However, using such approaches, die floor planning, architectural design, and area constraints often lead to on-die MIM capacitance deficiencies that negatively impact power delivery performance.

The use of package level decoupling capacitors such as die-side and land-side capacitors can be unsatisfactory because of distance and/or location constraints. For example, some complex die architectures (multi-die tiling) and large single die configurations do not allow package level capacitors to be positioned close enough to the PHY areas that can benefit from enhanced power delivery performance.

BRIEF DESCRIPTION OF THE DRAWINGS

FIG. 7 is a schematic of a computer system according to an embodiment.

DESCRIPTION OF THE EMBODIMENTS

Figure 1A:
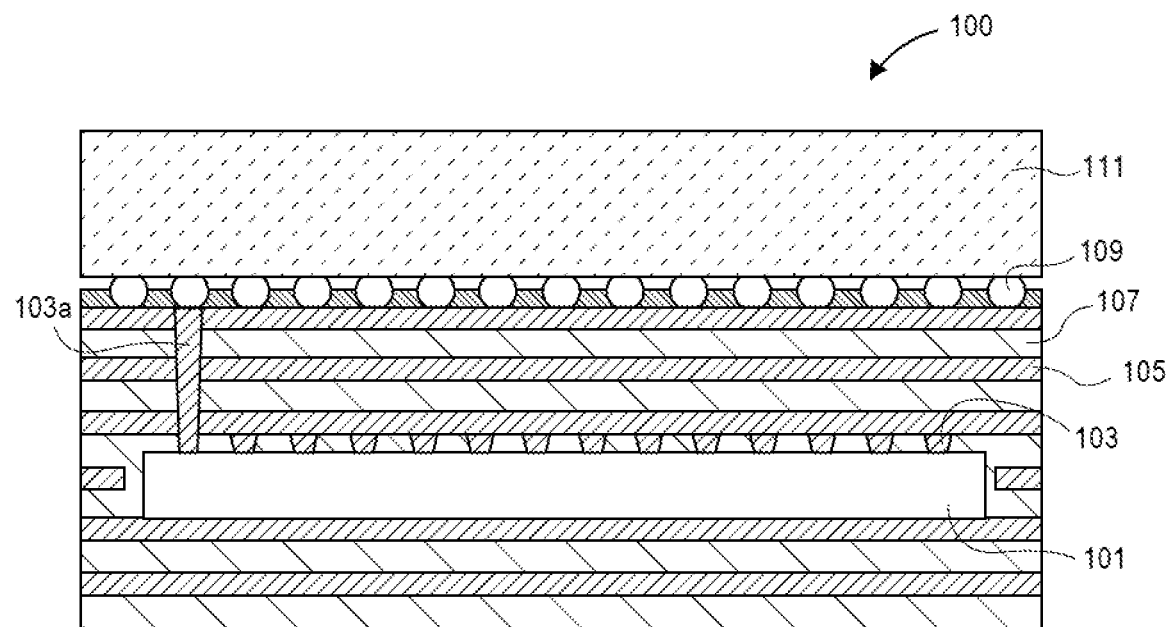
FIG. 1A illustrates a cross-section of a surface mount die and package substrate with an embedded metal-insulator-metal (MIM) capacitor die in accordance with an embodiment.

The embedding of an MIM capacitor die in a package substrate for providing capacitance to a surface mounted die is described. It should be appreciated that although embodiments are described herein with reference to example embedded MIM capacitor die implementations, the disclosure is more generally applicable to embedded silicon-based capacitor die implementations as well as other type embedded capacitor die implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

FIG. 1A illustrates a cross-section 100 of a surface mount die and package substrate with an embedded metal-insulator-metal (MIM) capacitor die in accordance with an embodiment. In an embodiment, the embedded MIM capacitor die can be placed anywhere underneath the surface mount die (generally in build-up layers) in the package substrate and has a configurable capacitance that can be set based on the capacitor decoupling and/or power delivery performance deficiency of the surface mount die that is being addressed. FIG. 1A shows embedded MIM capacitor die 101, substrate vias 103, power delivery structure 105, insulating layers 107, interconnection structure 109, and surface mount die 111.

Referring to FIG. 1A, the embedded MIM capacitor die 101 is a die that includes one or more capacitors that are composed of parallel plates and a dielectric layer between the plates. The embedded MIM capacitor die 101 includes one or more decoupling capacitors for the surface mount die 111. In an embodiment, the embedded MIM capacitor die 101 is located entirely or partially underneath the surface mount die 111. In an embodiment, the embedded MIM capacitor die 101 is positioned underneath at least a portion of the surface mount die 111 that corresponds to power delivery interface circuitry of the surface mount die 111. In an embodiment, the power delivery interface circuitry can be a part of other circuitry that can include but is not limited to switching logic and PHY blocks (such as can be implemented by FPGAs). In an embodiment, the area of the package substrate that corresponds to the power delivery interface circuitry of the surface mount die 111 is in build-up layers of the package substrate. In an embodiment, the build-up layers of the package substrate 100 are stacked layers of high density wiring and insulation that enable high speed operation and dense packaging of integrated circuits. In an embodiment, the build-up layers can be front-side or back-side build-up layers. In an embodiment, the surface mount die 111 can be connected to the embedded MIM capacitor die 101 with a short and direct connection 103a. In an embodiment, the short and direct connection 103a can have only straight and vertical components. In other embodiments, the short and direct connection 103a can have one or more non-vertical components.

The substrate vias 103 couple the embedded MIM capacitor die 101 to surface mount die interconnection structures 109 or to power delivery structures 105. The power delivery structures 105 connect the embedded MIM capacitor die 101 to surface mount die interconnection structures 109. The surface mount die interconnection structures 109 connect the embedded MIM capacitor die 101 to the surface mount die 111. In an embodiment, substrate vias 103 with a large pad and pitch can be used for via landing larger embedded die.

In an embodiment, the embedded MIM capacitor die 101 can be embedded in localized areas of the package substrate under IP blocks. In an embodiment, because short and direct paths to the surface mount die are used, the embedded MIM capacitor die 101 significantly improves power delivery performance. In an embodiment, because the embedded MIM capacitor die 101 can be embedded in a localized area directly underneath the IP block, the die positioning flexibility needed to maximize a package-level power delivery solution is enabled for high-speed switching logic and PHYs (such as can be implemented with FPGAs). FPGA and server dies can be packaged in a wide range of form factors that can be suitable for different performance specifications although using the same base die. In an embodiment, discrete embedded MIM capacitor dies can be used to provide a capacitance boost to circuitry where a benefit to performance can be realized.

In an embodiment, the embedded MIM capacitor die 101 can be embedded on any of the front side build-up layers and thus can be positioned in a manner that minimizes impact to surface mount die power delivery design on the outermost package substrate layers. Because the embedded MIM capacitor die 101 can be thinned, in an embodiment, one or two build-up layers may be used to accommodate the embedded MIM capacitor die 101. In addition, it should be noted that that the embedded MIM capacitor die 101 can also be embedded on back side build-up layers or in core layers.

In an embodiment, the embedded MIM capacitor die 101 can include two or more MIM capacitor layers. In an embodiment, the embedded MIM capacitor die 101 or discrete MIM capacitor component can include three or more metal layers. In an embodiment, other numbers of metal layers can be used. In an embodiment, the embedded MIM capacitor die 101 or discrete MIM capacitor component can be formed in a low-cost silicon process that uses three or more metal layers.

With the increasing power stability requirements for HSIO and EMIB devices, PHYs require effective decoupling capacitor solutions that provide capacitance in close physical proximity to the PHY. In an embodiment, the short direct path from the embedded MIM capacitor die 101 to the surface mount die maximizes the effectiveness of the decoupling capacitor. Thus, embodiments utilize package substrate embedded MIM capacitor dies (single or multilayer) as a decoupling capacitor solution to address deficiencies of surface mount die packages that do not include a component level decoupling capacitor (DSC/LSC). This saves both surface mount die package area and cost. MIM size reductions do not scale linearly with process node. Thus, a supplemental decoupling capacitor close to the die may be needed for new technology nodes.

In packaging applications that involve inflexible surface mount die area constraints, increasing the surface mount die area to accommodate an on-die MIM capacitor (which is a conventional approach) is generally not an option because of the associated increase in die size. Because the embedded MIM capacitor die 101 can be fabricated using low cost process nodes, it can provide a low cost solution.

In conventional approaches package level decoupling capacitors such as die side and land side capacitors do not address first drop effectively because of distance or location constraints. Additionally, some surface mount dies that require supplemental external capacitance cannot address such by die side capacitors due to placement constraints. For example, some complex die architectures (e.g. multi-die tiling) and large single die configurations do not allow package level capacitors to be positioned close enough to the PHY areas, which may need enhanced power delivery performance.

Figure 1B:
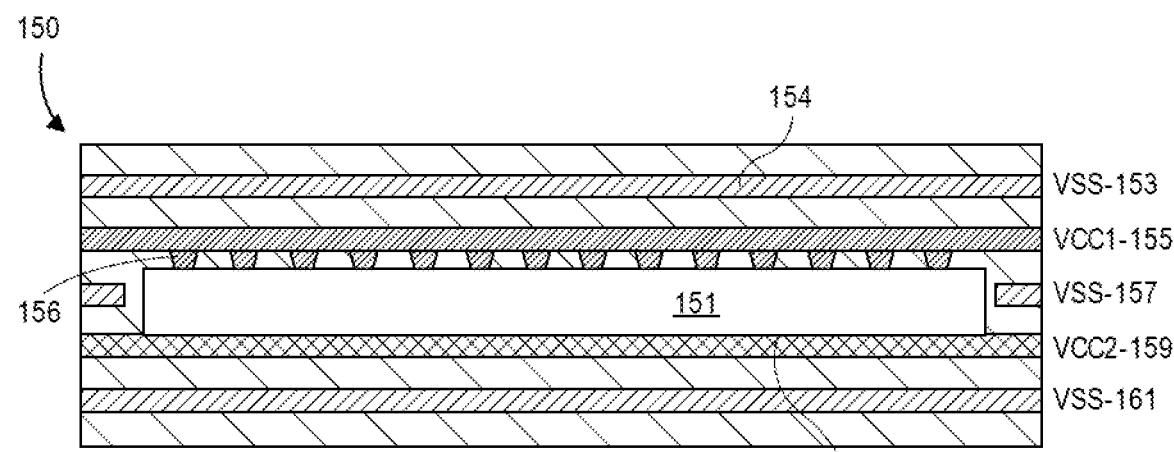
FIG. 1B is an illustration of a power delivery network of a package substrate that includes an embedded MIM capacitor die according to an embodiment.

FIG. 1B is an illustration of a power delivery network of a package substrate with an embedded MIM die for use as a decoupling solution for a surface mount die such as shown in FIG. 1A. FIG. 1B shows embedded MIM capacitor die 151, ground voltage VSS 153, ground delivery structure 154, voltage source VCC1 155, package vias 156, ground voltage VSS 157, voltage source VCC2 159 and ground voltage VSS 161. It should be appreciated that VCC1 155, VCC2 159 and VSS (e.g., 153, 157 and 161) represent separate power domains. The embedded MIM capacitor die 151 is coupled on its top surface to the voltage source VCC1 155 through package vias 156 and on its bottom surface to voltage source VCC2 159 through power delivery structure 158. The package substrate 150 provides wiring layers for ground voltages VSS 153, VSS 157 and VSS 161 that are located above, adjacent to and below embedded MIM die. It should be appreciated that because the embedded MIM capacitor die 151 of the package substrate 150 has a small footprint, its deployment has minimal impact on the power delivery network.

Figure 1C:
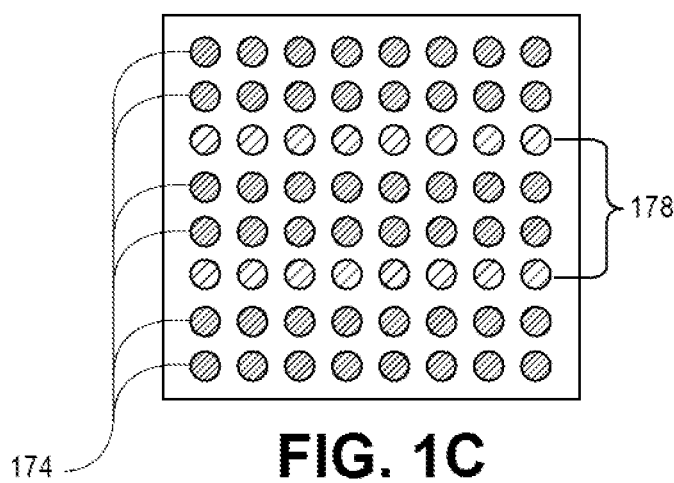
FIG. 1C is an illustration of an example top die pad view according to an embodiment.
Figure 1D:
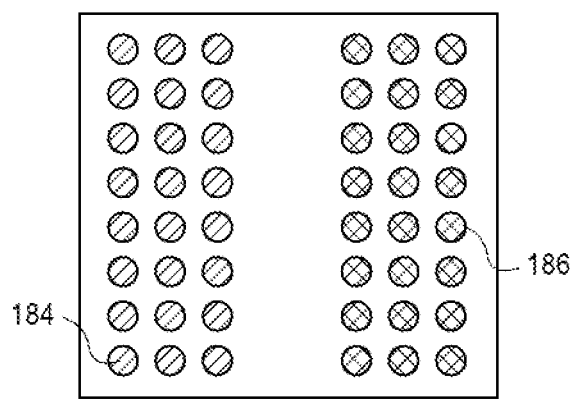
FIG. 1D is an illustration of an example bottom die pad view according to an embodiment.
Figure 1E:
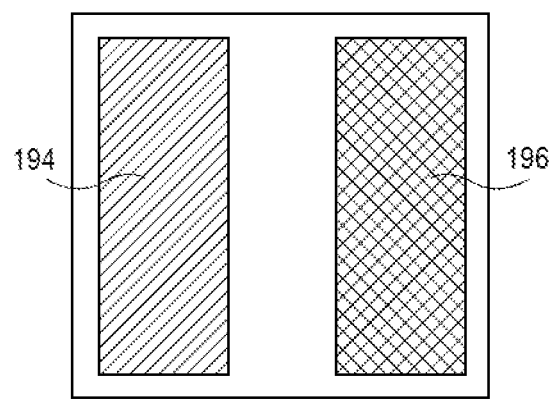
FIG. 1E is an illustration of an example bottom die pad view according to an embodiment.

FIGS. 1C-1E show example top and bottom embedded MIM capacitor die pad patterns for coupling the embedded MIM capacitor die 151 of FIG. 1B to the package power delivery network described with reference to FIG. 1B. FIG. 1C shows an example top die pad view 170 for the embedded MIM die 151. Referring to FIG. 1C, the top die pad view 170 shows a plurality of rows of die pads 174 that are associated with the first voltage domain VCC1 155 and a plurality of rows of die pads 178 that are associated with the ground voltage VSS 153. The first, second, fourth, fifth, seventh and eighth rows are associated with first voltage domain VCC1 155 and rows three and six are associated with ground voltage VSS 153. This configuration of the top die pads is only exemplary. In other embodiments, there can be other configurations of the top die pads. FIG. 1D shows an example bottom die pad view 180 with two sided connection. Referring to FIG. 1D, the bottom die pad view 180 shows a plurality of rows of die pads 184 on the left side of the die, and a plurality of adjacent rows of die pads 186 on the right side of the die. The plurality of rows of die pads 184 on the left side of the die are associated with ground voltage VSS 161 and the plurality of rows of die pads 186 on the right side of the die are associated with second voltage domain VCC2 159. In the FIG. 1D example, there are eight horizontally aligned pairs of rows where each of the pairs of rows are separated by the same distance. This configuration of the bottom die pads is only exemplary. In other embodiments, there can be other numbers of pairs of rows and each of the pairs of rows can include other numbers of pads. FIG. 1E shows another example bottom die pad pattern 190 for an embedded capacitor die (e.g., MIM capacitor die 151). Referring to FIG. 1E, the bottom die pad configuration includes a single left side rectangular die pad 194 corresponding to ground voltage VSS 161 and a single right side rectangular die pad 196 corresponding to second voltage domain VCC2 159. This configuration of the bottom die pads is only exemplary. In other embodiments, other configurations can be used. It should be appreciated that the pad configurations of FIGS. 1D and 1E correspond to double sided capacitor die configurations such as are described herein with reference to FIGS. 3C-3E.

Figure 2B:
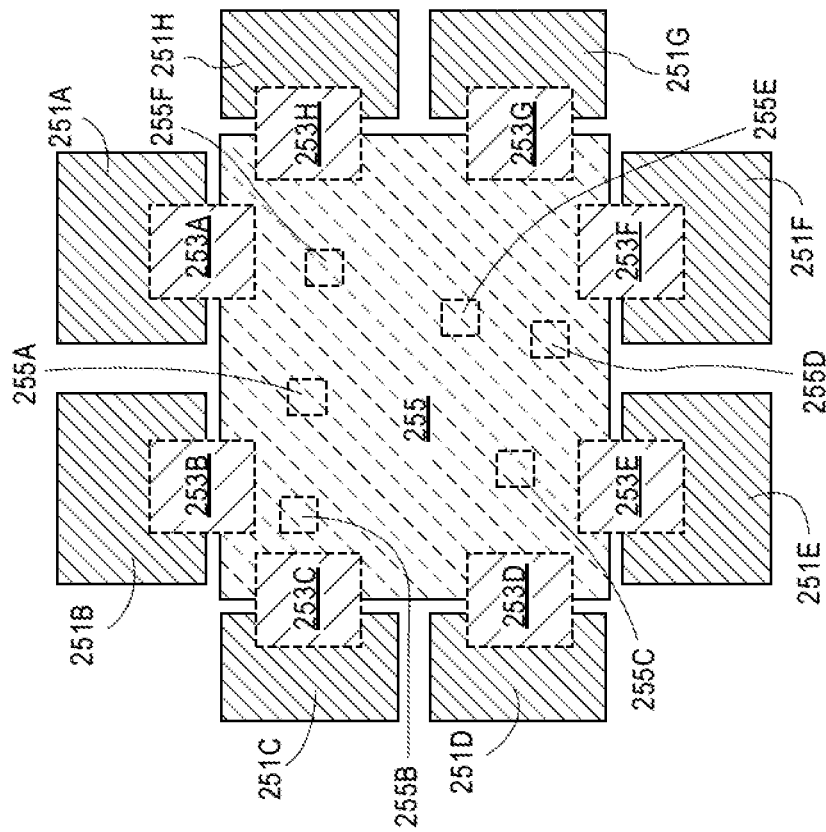
FIG. 2B is an illustration of a heterogeneous EMIB die complex according to an embodiment.
Figure 2A:
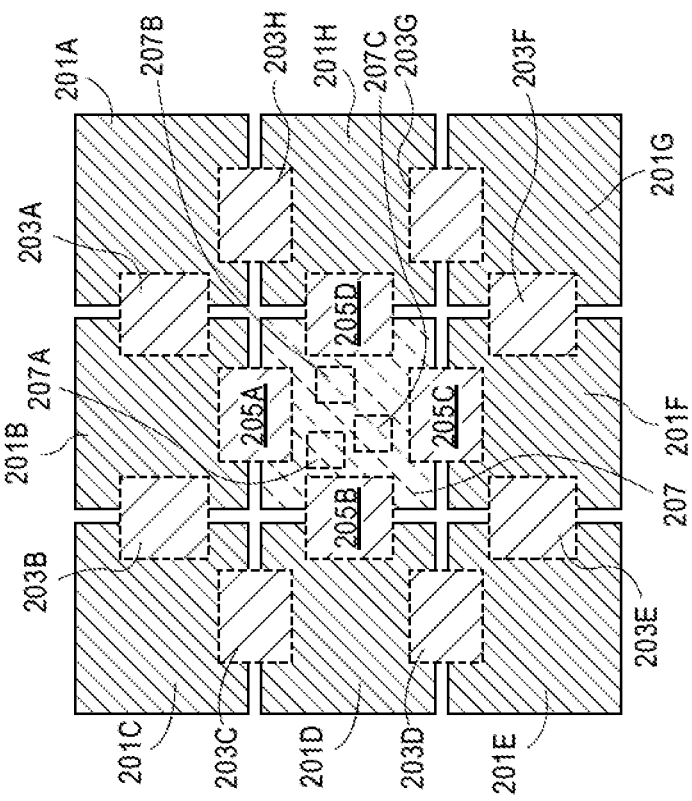
FIG. 2A is an illustration of a homogeneous embedded multi-die interconnect bridge (EMIB) die complex according to an embodiment.

FIG. 2A is an illustration of a homogeneous embedded multi-die interconnect bridge (EMIB) die complex example according to an embodiment. FIG. 2A illustrates the use of EMIB devices in the integration of dies with similar functions into a single package. FIG. 2A shows dies 201a-201h, EMIBs 203a-203h, EMIB 205a, EMIB 205b, EMIB 205c and EMIB 205d, surface mount die 207 and embedded MIM capacitor dies 207a-207c. In FIG. 2A, dies 201a-201h can include but are not limited to switching logic and PHY blocks (such as may be implemented by FPGAs). EMIBs 203a-203h are I/O connectors that enable communication between adjacent dies. EMIBs 205a-205d are I/O connectors that couple dies 201b, 201d, 201f and 201h to surface mount die 207. In the arrangement shown in FIG. 2A, dies 201a-201h are placed around the surface mount die 207 such that the surface mount die 207 is surrounded on each side. This prevents the placement of die side and land side capacitors in sufficiently close proximity to the surface mount die 207 to adequately address capacitance deficiencies of the surface mount die 207. In an embodiment, the embedded MIM capacitor dies 207a-207c that are embedded underneath surface mount die 207 can be positioned anywhere underneath the surface mount die 207 to address decoupling capacitance and/or power delivery performance deficiencies. In an embodiment, the area of the package substrate where the MIM capacitor dies 207a-207c are embedded is in build-up layers of the package substrate (e.g., the package substrate in FIG. 1A). In an embodiment, the build-up layers can be front-side or back-side build-up layers.

FIG. 2B is an illustration of a heterogeneous EMIB die complex example according to an embodiment. FIG. 2B illustrates the use of EMIB devices in the integration of dies with dissimilar functions into a single package. FIG. 2B shows dies 251a-251h, EMIBs 253a-253h, surface mount die 255 and embedded MIM capacitor dies 255a-255f. In FIG. 2B, dies 251a-251h can include but are not limited to switching logic and PHY blocks (such as can be implemented by FPGAs). EMIBs 253a-253h are I/O connectors that couple dies 251a-251h to surface mount die 255. In the arrangement shown in FIG. 2B, dies 251a-251h are placed around the surface mount die 255 such that the surface mount die 255 is surrounded on each side. This prevents the placement of die side and land side capacitors in sufficiently close proximity to the surface mount die 255 to adequately address capacitance deficiencies of the surface mount die 255. In an embodiment, the embedded MIM capacitor dies 255a-255f are embedded in a package substrate underneath particular circuitry or parts of circuitry of the surface mount die 255. In an embodiment, the area of the package substrate that corresponds to the circuitry or parts of circuitry of the surface mount is in build-up layers of the package substrate (e.g., the package substrate in FIG. 1A). In an embodiment, the build-up layers of the package substrate are stacked layers of high density wiring and insulation for high speed and densely packaged integrated circuits. In an embodiment, the build-up layers can be front-side or back-side build-up layers.

Figure 3A:
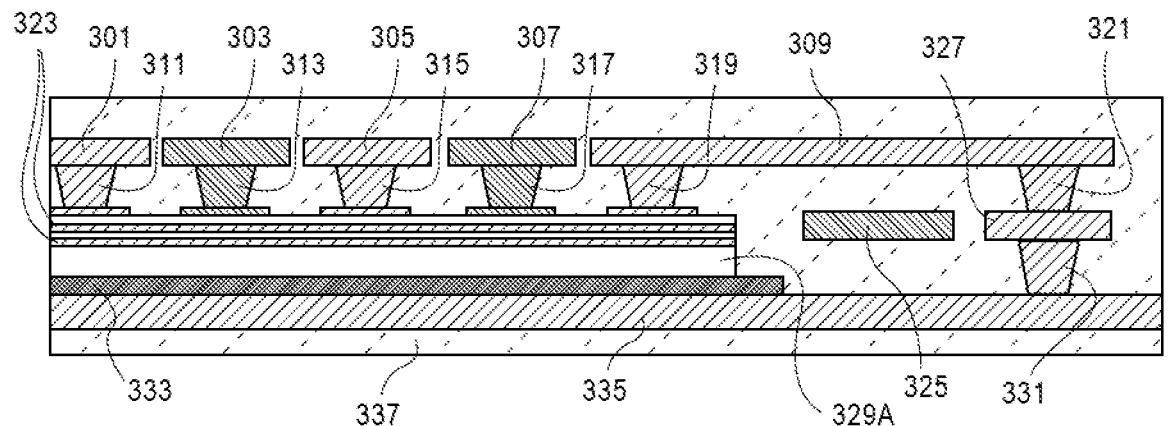
FIG. 3A is an illustration of a cross-section of a single sided embedded MIM capacitor die spanning a single package layer according to an embodiment.

FIGS. 3A-3E are die and package cross-sections that illustrate die-to-package interconnect approaches in accordance with an embodiment. In particular, FIGS. 3A-3E illustrate die-to-package interconnect approaches for embedded die having various internal designs and sizes. FIG. 3A is an illustration of a die-to-package interconnect structure for a single sided embedded MIM capacitor die spanning a single package layer in accordance with an embodiment. FIG. 3A shows power delivery structure 301, power delivery structure 303, power delivery structure 305, power delivery structure 307, power delivery structure 309, substrate via 311, substrate via 313, substrate via 315, substrate via 317, substrate via 319, substrate via 321, MIM layers 323, power delivery structure 325, power delivery structure 327, embedded MIM capacitor die 329A, substrate via 331, non-conductive bridge seating film 333, power delivery structure 335 and package material 337.

Referring to FIG. 3A, the single sided embedded MIM capacitor spanning a single package layer includes a thin embedded MIM capacitor 329A. In the FIG. 3A example, the thin embedded MIM capacitor 329A is able to be accommodated by a single package layer. The power delivery structures 301, 305, 309, 327 and 335 couple the embedded MIM capacitor 329A to voltage domain VCC1. Power delivery structure 303, 307 and 325 couple the embedded MIM capacitor 329A to ground voltage VSS. The embedded MIM capacitor die 329A is coupled to voltage VCC1 though substrate vias 321 and 331. The substrate vias 311, 315, 319, 321, 331 deliver voltage VCC1 to the embedded MIM capacitor die 329A. The substrate vias 313 and 317 deliver the ground voltage to the embedded MIM capacitor die 329A. The embedded MIM capacitor die 329A is located above the non-conductive bridge seating film 333. In the example of FIG. 3A, the power delivery structures and substrate vias are a part of a single-sided die-to-package interconnect structure that is embedded in build-up layers and that supports a single power domain.

Figure 3B:
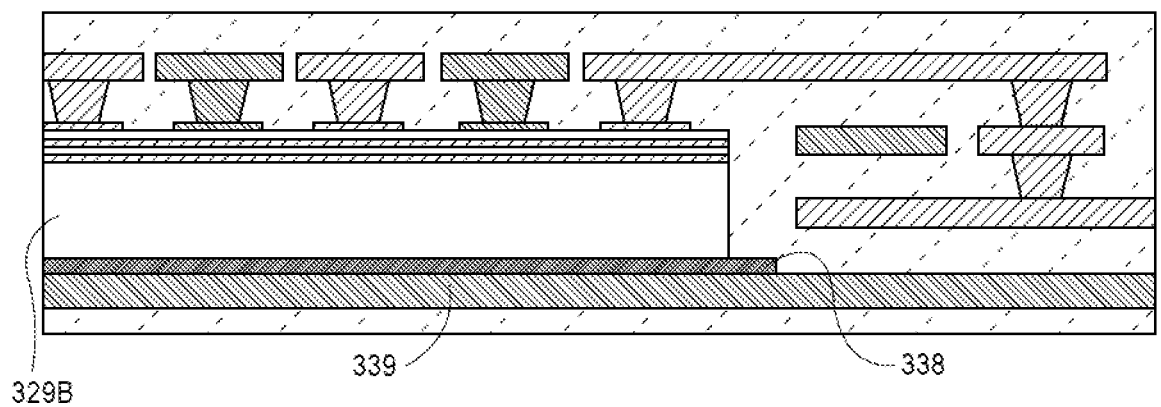
FIG. 3B is an illustration of a cross-section of a single sided embedded MIM capacitor die that extends across two package layers according to an embodiment.

FIG. 3B is an illustration of a die-to-package interconnect structure for a single sided embedded MIM capacitor die that extends across two package layers. In addition, to components described with reference to FIG. 3A, FIG. 3B shows a thicker embedded MIM capacitor die 329B, than 329A shown in FIG. 3A, which is mounted above a power delivery structure 339 that is coupled to the ground voltage VSS. The thicker embedded MIM capacitor die 329B is mounted directly on a non-conductive bridge seating film 338. In FIG. 3B, the power delivery structure 339 is a part of a single-sided interconnection structure that is embedded in build-up layers and that can support up to two separate power domains.

Figure 3C:
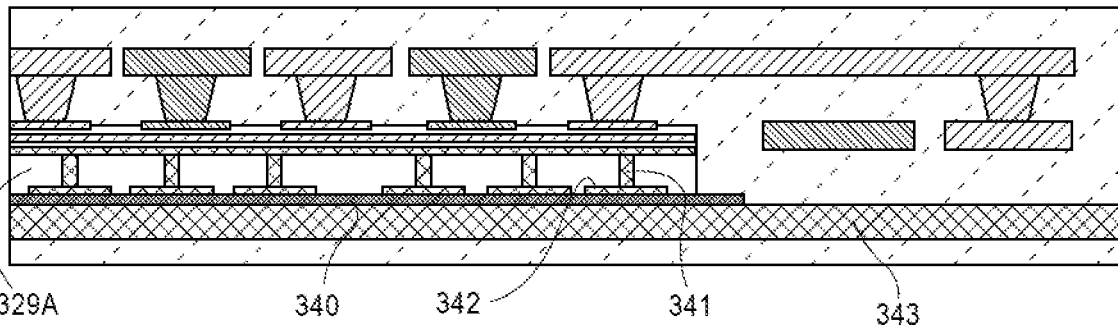
FIG. 3C is an illustration of a cross-section of a double sided build-up embedded MIM capacitor die that spans a single package layer according to an embodiment.

FIG. 3C is an illustration of a cross-section of a die-to-package interconnect structure for a double sided build-up embedded MIM capacitor die that spans a single package layer. In addition, to components described with reference to one or more of FIGS. 3A and 3B, FIG. 3C shows a thin embedded MIM capacitor die 329A similar to that shown in FIG. 3A that is mounted on a conductive bridge seating film 340 that is formed above power delivery structure 343 that is coupled to the voltage domain VCC2. The thin embedded MIM capacitor die 329A includes via interconnects 341 and contacts 342 that couple the embedded MIM capacitor die 329A to the voltage domain VCC2. In FIG. 3C, power delivery structure 343, via interconnects 341 and contacts 342 are a part of a double-sided interconnection structure that is embedded in build-up layers and that can support up to two separate power domains.

Figure 3D:
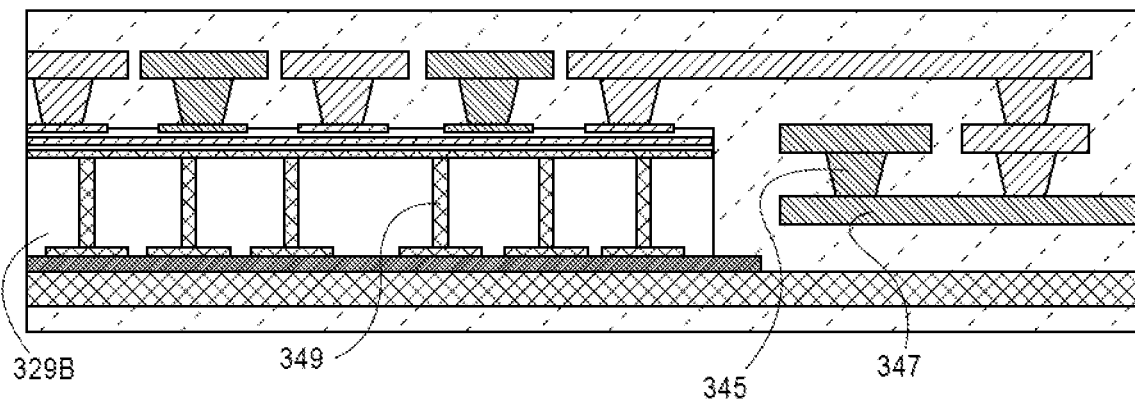
FIG. 3D is an illustration of a cross-section of a double sided build-up embedded MIM capacitor die that spans two package layers according to an embodiment.

FIG. 3D is an illustration of a cross-section of a die-to-package interconnect structure for a double sided build-up embedded MIM capacitor die that spans two package layers. In addition, to components described with reference to one or more of FIGS. 3A-3C, FIG. 3D shows a thick embedded MIM capacitor die 329B similar to that shown in FIG. 3B that is mounted on a conductive bridge seating film 340 that is formed above power delivery structure 343 that is coupled to voltage domain VCC2. The thicker embedded MIM capacitor die 329B includes via interconnects 349 that are greater in length than the via interconnects 341 that are shown in FIG. 3C. In addition to the power delivery structure 343 and the via interconnects 349, FIG. 3D also shows additional power delivery structure 347 and substrate via 345 that are coupled to the ground voltage VSS. In FIG. 3D, conductive bridge seating film 340, power delivery structure 343, power delivery structure 347 and via interconnects 349 are a part of a double-sided interconnection structure that is embedded in build-up layers and that can support up to two separate power domains.

Figure 3E:
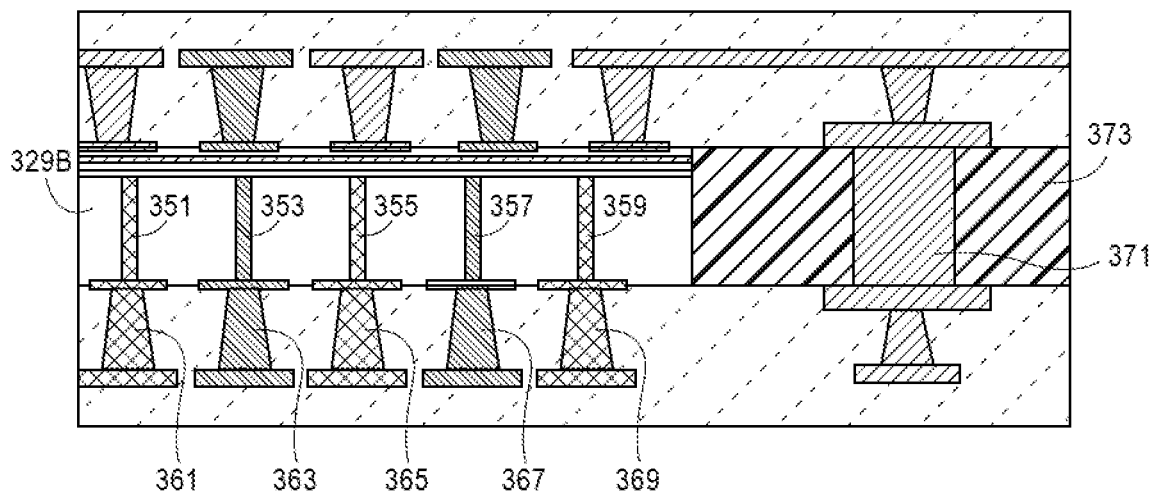
FIG. 3E is an illustration of a cross-section of a double sided core embedded MIM capacitor die according to an embodiment.

FIG. 3E is an illustration of a cross-section of a double sided core embedded MIM capacitor die. FIG. 3E shows the thick embedded MIM capacitor die 329B that is formed in the substrate core 373 of the package substrate. In addition, to components described with reference to one or more of FIGS. 3A-3D, FIG. 3E shows via interconnects 351-359, substrate vias 361-369, plated through hole (PTH) 371 and substrate core 373. In FIG. 3F, the substrate vias 361, 365 and 369 couple the embedded MIM capacitor die 329B to voltage domain VCC2 and the substrate vias 363 and 367 couple the embedded MIM capacitor die 329 to the ground voltage VSS. In FIG. 3E, via interconnects 351-359 and substrate vias 361-369 are a part of a double-sided interconnection structure that is embedded in the core layers of the package substrate and that can support up to two separate power domains.

FIGS. 3A-3E show that embodiments provide flexibility as it regards interconnection approaches for accommodating a wide variety of embedded die structural configurations and sizes. For example, embodiments accommodate embedded die configurations that include but are not limited to single sided configuration, double sided configuration, designs that support a single power domain, designs that support a plurality of voltage domains, etc. Different embedded MIM capacitor die configurations that are structured in accordance with an embodiment are described with reference to FIGS. 4A-4C and 5.

Figure 4A:
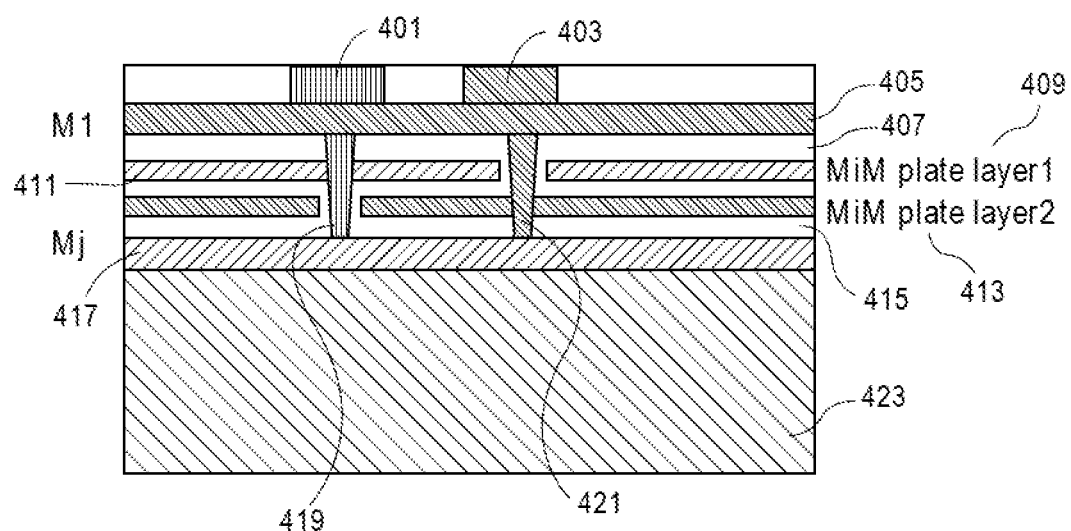
FIG. 4A illustrates a cross-sectional view of an embedded MIM capacitor die according to an embodiment.
Figure 4B:
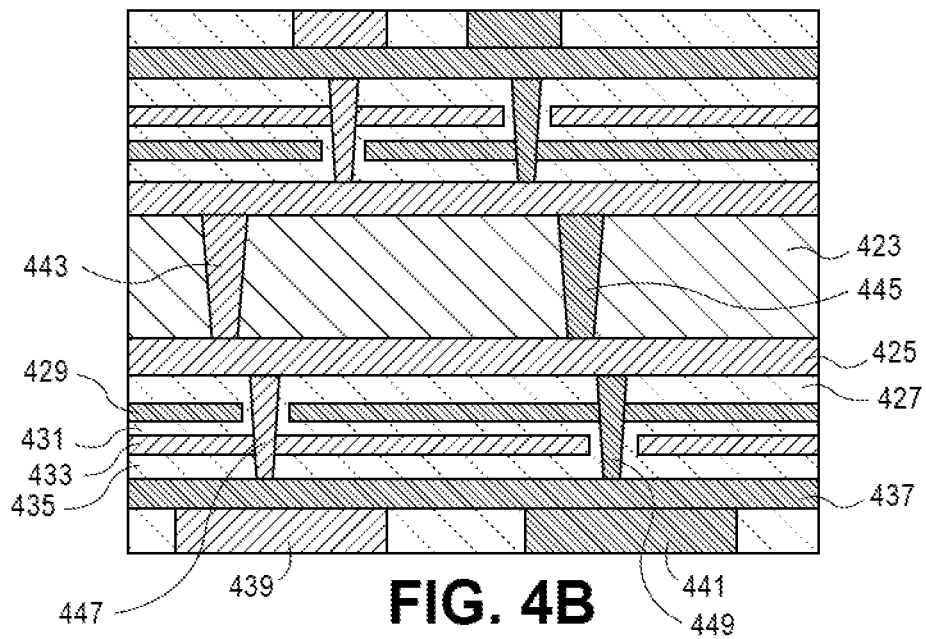
FIG. 4B illustrates a cross-sectional view of an embedded MIM capacitor die according to an embodiment.
Figure 4C:
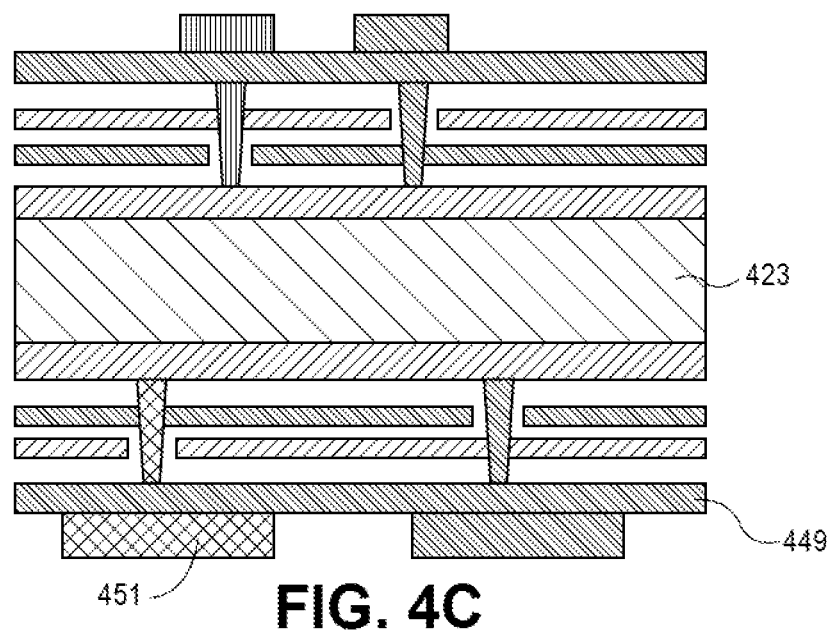
FIG. 4C illustrates a cross-sectional view of an embedded MIM capacitor die according to an embodiment.

FIGS. 4A-4C illustrate example cross-sections of embedded MIM capacitor dies in accordance with an embodiment. As shown FIGS. 4A-4C, in an embodiment, embedded MIM capacitor dies can be patterned as single sided or double sided and can support one or more power domains as described above. In other embodiments, embedded MIM capacitor dies can have other structures.

FIG. 4A illustrates a cross-sectional view of a single sided embedded MIM capacitor die. In FIG. 4A, the one sided embedded MIM capacitor die includes interconnect 401, interconnect 403, power delivery metal layer 405, insulator layer 407, metal layer 409, insulator layer 411, metal layer 413, insulator layer 415, power delivery metal layer 417, via 419, via 421 and dielectric 423. The one sided embedded MIM capacitor die of FIG. 4A can support a single voltage domain.

FIG. 4B illustrates a cross-sectional view of an embedded MIM capacitor die according to an embodiment. In particular, FIG. 4B illustrates a cross-sectional view of a two sided embedded MIM capacitor die. In addition, to the structures shown in FIG. 4A, FIG. 4B shows metal layer 425, insulator 427, metal layer 429, insulator 431, metal layer 433, insulator 435, metal layer 437, interconnect 439, interconnect 441, via 443, via 445, via 447 and via 449. In an embodiment, the two sided embedded MIM capacitor die of FIG. 4B supports a single power domain.

FIG. 4C illustrates a cross-sectional view of an embedded MIM capacitor die according to an embodiment. In particular, FIG. 4C illustrates a cross-sectional view of a two sided embedded MIM capacitor die. In addition, to the structures shown in FIGS. 4A and 4B, FIG. 4C shows power distribution metal layer 449 and die pad 451 for second voltage domain. In FIG. 4C dielectric 423 isolates the two sides of the embedded MIM capacitor die. For example, unlike FIG. 4B vias (e.g., vias 443 and 445) are not used to connect the two sides of the embedded MIM capacitor die. The power distribution metal layer 449 is used to connect the embedded MIM capacitor die to a second voltage domain through die pads 451. Thus, in an embodiment, the two sided embedded MIM capacitor die of FIG. 4C supports a two power domains.

As regards the embodiments described with reference to FIGS. 4A-4C, the illustrated variety of embedded die configuration options enable significant scalability of the MIM capacitance value that is proportional to the area. For example, in a two or three-layer embedded MIM capacitor die embodiment, MIM capacitance can reach 15-25 nF/mm$^2$ for a single sided embedded MIM capacitor die. For a two sided embedded MIM capacitor die embodiment, MIM capacitance can reach 30-50 nF/mm$^2$. In other embodiments, other capacitance densities can be reached. In comparison to embodiments, in on-die power delivery approaches, the capacitance value scalability is not good because the on-die MIM area is very limited and usually shared by multiple power rails. In an embodiment, the capacitance value scalability offered by the variety of embedded MIM die designs of embodiments can address on-die MIM deficiency compensation flexibly.

Figure 4D:
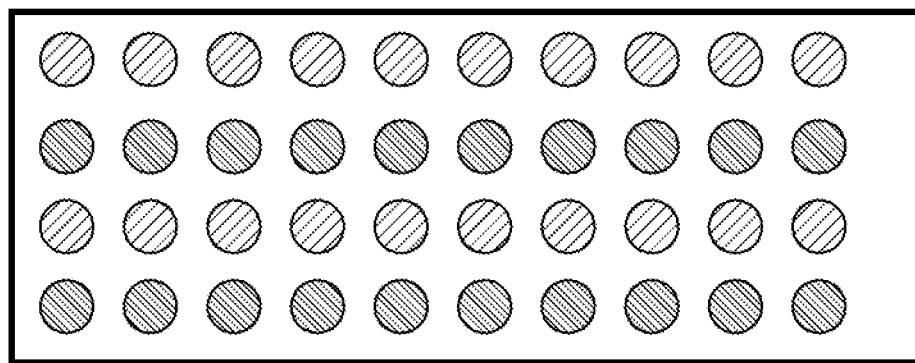
FIG. 4D illustrates a top view of the embedded MIM capacitor die of FIG. 4C.

FIG. 4D illustrates a top view of the MIM of FIG. 4C. In the FIG. 4D example, there are four rows and each row includes ten die pads. The die pads in the first and third rows are associated with a first voltage domain. The die pads in the second and third rows are associated with a ground voltage. This configuration of the top die pads is only exemplary. In other embodiments, there can be other numbers of rows of die pads and each of the rows of die pads can include other numbers of die pads.

Figure 4E:
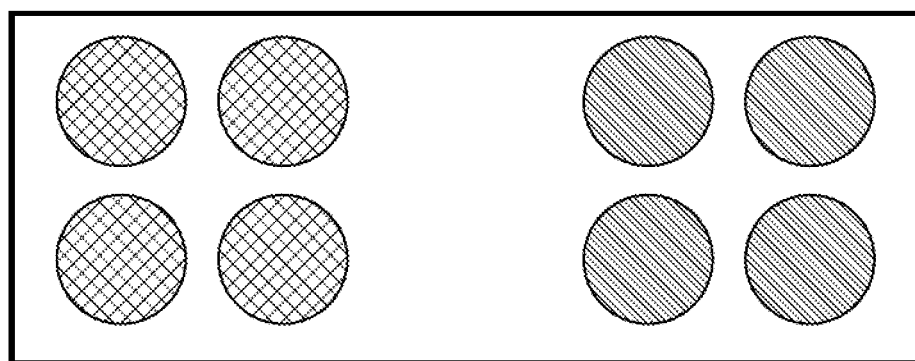
FIG. 4E illustrates a bottom view of the embedded MIM capacitor die of FIG. 4C.

FIG. 4E illustrates a bottom view of the MIM of FIG. 4C. In the FIG. 4E example, there are a first set of four die pads on the left side of the die and a second set of four die pads on the right side of the die. The set of four die pads on the left side of the die is associated with the second voltage domain and the set of four die pads on the right side of the die is associated with the ground voltage. This configuration of the top die pads is only exemplary. In other embodiments, there can be other numbers of rows and each of the rows can include other numbers of pads.

Figure 5:
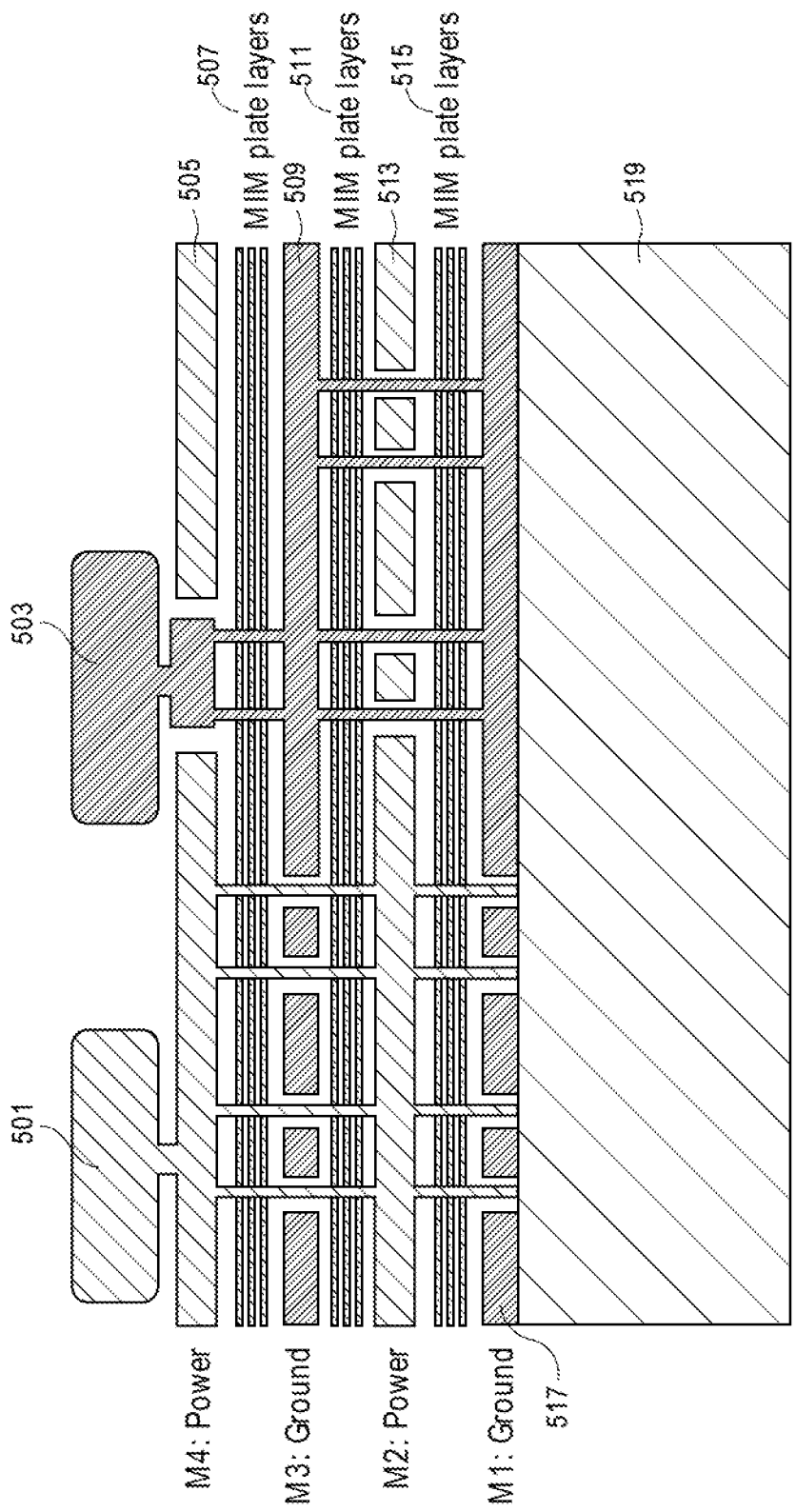
FIG. 5 is an illustration of a cross-sectional view of a multilayer MIM capacitor structure according to an embodiment.

FIG. 5 is an illustration of a cross-sectional view of an embedded capacitor die having a multilayer MIM structure according to one embodiment. The MIM structure of FIG. 5 enables the scaling of capacitance in an embedded MIM capacitor die environment such as is described herein. FIG. 5 shows die pad 501, die pad 503, power delivery structure 505, MIM plate layers 507, ground structure 509, MIM plate layers 511, power delivery structure 513, MIM plate layers 515, ground structure 517 and substrate 519. Referring to FIG. 5, die pad 501 and die pad 503 provide power and ground voltages to the multilayer MIM structure. The MIM layers 507 are formed between power delivery structure 505 and ground structure 509. The MIM layers 511 are formed between ground structure 509 and power delivery structure 513. The MIM layers 515 are formed between ground structure 517 and power delivery structure 513. In the FIG. 5 embodiment, MIM capacitance per mm$^2$ is enhanced as compared to some other designs. For example, the MIM design of FIG. 5 can provide 70 nF/mm$^2$ while a 10 nm MIM design can provide 25 nF/mm$^2$. In an embodiment, the multilayer approach of FIG. 5 provides additional capacitance scaling capacity that can be used in addressing decoupling capacitance and/or power delivery performance deficiencies of circuitry of surface mount dies.

In an embodiment, the embedded MIM die as described herein significantly improves the AC resonance impedance peak at the power rail of a surface mounted die that is supported by the embedded capacitor die as compared to the AC resonance impedance peak at the power rail of the surface mounted die if not supported by the embedded capacitor die. The improvement is manifested by a significant reduction of the power rail AC resonance impedance.

Figure 6:
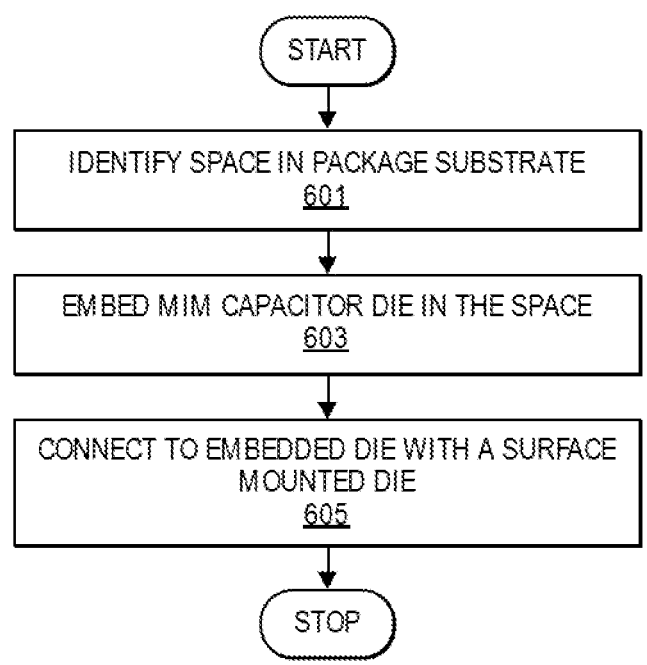
FIG. 6 is a flowchart of a method of providing an embedded MIM component in an embodiment.

FIG. 6 is a flowchart of a method of providing an embedded MIM component in an embodiment.

Referring to FIG. 6, at 601 a space is identified in a package substrate of a surface mount die that is at least partially underneath a location corresponding to the surface mount die. In an embodiment, the space can be any position underneath, or partially underneath, a surface mount die. In an embodiment, the space is a position underneath the power delivery interface of circuitry in the surface mount die.

At 603, an MIM capacitor die is embedded in the identified space of the package substrate (in build-up layers of the space, etc.), and at 605, the surface mount die is connected to the embedded MIM die with a short and direct connector. Die-to package connections are described herein with reference to FIGS. 3A-3E.

FIG. 7 is a schematic of a computer system 700, in accordance with an embodiment of the present invention. The computer system 700 (also referred to as the electronic system 700) as depicted can include an embedded MIM capacitor die, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, embedded MIM capacitor die, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having embedded MIM capacitor die, according to any of the several disclosed embodiments and their equivalents, an electronic system, a computer system, one or more methods of fabricating an integrated circuit, and one or more methods of fabricating an electronic assembly that includes a package substrate having embedded MIM capacitor die, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having embedded MIM capacitor die embodiments and their equivalents. A foundation substrate may be included, as represented by the dashed line of FIG. 7. Passive devices may also be included, as is also depicted in FIG. 7.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A package substrate including a capacitor die embedded in the package substrate at least partially underneath a location of power delivery interface circuitry in a surface mounted die and connection terminals accessible at a surface of the die embedded in the package substrate to provide connection to the surface mounted die. Metal-insulator-metal layers inside the die embedded in the package substrate are coupled to the connection terminals.

Example embodiment 2: The package substrate of embodiment 1, wherein the surface mount die is an integrated circuit die, an FPGA or an ASIC.

Example embodiment 3: The package substrate of embodiment 1, wherein the capacitor die is in front side build-up layers of the package substrate.

Example embodiment 4: The package substrate of embodiment 1, wherein the capacitor die includes a straight and vertical wiring path to the surface mounted die.

Example embodiment 5: The package substrate of embodiment 1, wherein the capacitor die supports at least two power domains.

Example embodiment 6: The package substrate of embodiment 1, wherein the capacitor die occupies two or less levels of the package substrate.

Example embodiment 7: The package substrate of embodiment 1, wherein the capacitor die is in a core of the package substrate.

Example embodiment 8: The package substrate of embodiments 1, 2, 3, 4, 5, 6 or 7, wherein the surface mounted die is surrounded by other surface mounted die that are coupled to the surface mounted die by EMIB connectors.

Example embodiment 9: A package substrate includes package interconnects, dielectric layers and metal layers. An embedded capacitor die in the package substrate is at least partially underneath a location of a power delivery interface circuitry of a surface mounted die.

Example embodiment 10: The package substrate of embodiment 9, wherein the surface mount die is an integrated circuit die, an FPGA or an ASIC.

Example embodiment 11: The package substrate of embodiment 9, wherein the embedded capacitor die is in front side build-up layers of the package substrate.

Example embodiment 12: The package substrate of embodiment 9, wherein the embedded capacitor die includes a straight vertical path to the embedded MIM capacitor die.

Example embodiment 13: The package substrate of embodiment 9, wherein the embedded capacitor die supports at least two power domains.

Example embodiment 14: The package substrate of embodiment 9, wherein the embedded capacitor die occupies two or less levels of the package substrate.

Example embodiment 15: The package substrate of embodiment 9, 10, 11, 12, 13 or 14, wherein the surface mounted die is surrounded by other surface mounted die that are coupled to the surface mounted die by EMIB connectors.

Example embodiment 16: A method includes identifying a space in a package substrate of a surface mount die that is at least partially underneath power delivery interface circuitry of the surface mount die and embedding a capacitor in the space of the package substrate in build-up layers of the space. The surface mount die is connected to the embedded capacitor die with a vertical and straight connector.

Example embodiment 17: The method of embodiment 16, wherein the embedded capacitor die is embedded in front side build-up layers of the package substrate.

Example embodiment 18: The method of embodiment 16, wherein the embedded capacitor die is embedded straight vertical path to the embedded capacitor die.

Example embodiment 19: The method of embodiment 16, wherein the embedded capacitor die supports at least two power domains.

Example embodiment 20: The method of embodiment 16, 17, 18 or 19 wherein the embedded capacitor die occupies two or less levels of the package substrate.

What is claimed is:

1. A package, comprising:
   a die;
   a surface mount die laterally spaced apart from the die, the surface mount die having a footprint;
   a bridge die below the die and the surface mount die, the bridge die coupled to the die, and the bridge die coupled to the surface mount die, wherein the bridge die is partially within the footprint of the surface mount die;
   a first capacitor die below the surface mount die, the first capacitor die entirely within the footprint of the surface mount die, wherein the first capacitor die is a first silicon-based capacitor die and is a first single-sided capacitor die; and
   a second capacitor die below the surface mount die, the second capacitor die entirely within the footprint of the surface mount die, wherein the second capacitor die is a second silicon-based capacitor die and is a second single-sided capacitor die.

2. The package of claim 1, wherein the second capacitor die is laterally spaced apart from the first capacitor die.

3. The package of claim 2, wherein the bridge die is laterally spaced apart from the first capacitor die.

4. The package of claim 1, further comprising:
   a third capacitor die below the surface mount die, the third capacitor die entirely within the footprint of the surface mount die, wherein the third capacitor die is a third silicon-based capacitor die and is a third single-sided capacitor die.

5. The package of claim 1, further comprising:
   a second die laterally spaced apart from the surface mount die, the second die on a side of the surface mount die laterally opposite the die.

6. The package of claim 5, further comprising:
   a second bridge die below the second die and the surface mount die, the second bridge die coupled to the second die, and the second bridge die coupled to the surface mount die.

7. The package of claim 1, wherein the bridge die is an embedded interconnect bridge (EMIB) die.

8. The package of claim 1, wherein the bridge die is partially within a footprint of the die.

9. The package of claim 1, wherein the die is a processor die.

10. A package, comprising:
    a first die having a footprint;
    a second die laterally spaced apart from the first die, the second die having a footprint;
    a third die below the first die and the second die, the third die coupled to the first die, and the third die coupled to the second die, wherein the third die is partially within the footprint of the first die and is partially within the footprint of the second die;
    a first capacitor die below the second die, the first capacitor die entirely within the footprint of the second die;
    a second capacitor die below the second die, the second capacitor die entirely within the footprint of the second die, and the second capacitor die laterally spaced apart from the first capacitor die; and
    a third capacitor die below the second die, the third capacitor die entirely within the footprint of the second die, and the third capacitor die laterally spaced apart from the second capacitor die.

11. The package of claim 10, wherein each of the first capacitor die, the second capacitor die, and the third capacitor die has connections on only a single side of the capacitor die.

12. The package of claim 10, wherein each of the first capacitor die, the second capacitor die, and the third capacitor die has connections on both sides of the capacitor die.

13. The package of claim 10, wherein each of the first capacitor die, the second capacitor die, and the third capacitor die is a silicon-based capacitor die.

14. The package of claim 10, wherein the third die is laterally spaced apart from the first capacitor die.

15. The package of claim 10, further comprising:
    a fourth die laterally spaced apart from the second die, the fourth die on a side of the second die laterally opposite the first die.

16. The package of claim 10, wherein the first die is a processor die, and the third die is an embedded interconnect bridge (EMIB) die.

17. A package, comprising:
    a surface mount die having a footprint, the surface mount die having a first side and a second side, the second side laterally opposite the first side;
    a first die laterally spaced apart from the first side of the first die surface mount die, the first die having a footprint;
    a second die laterally spaced apart from the first die;
    a third die laterally spaced apart from the second side of the surface mount die;
    a fourth die laterally spaced apart from the third die;
    a bridge die below the first die and the surface mount die, the bridge die coupled to the first die, and the bridge die coupled to the surface mount die, wherein the bridge die is partially within the footprint of the surface mount die and is partially within the footprint of the first die;
    a first capacitor die below the surface mount die, the first capacitor die entirely within the footprint of the surface mount die, wherein the first capacitor die is a first silicon-based capacitor die and is a first single-sided capacitor die;
    a second capacitor die below the surface mount die, the second capacitor die entirely within the footprint of the surface mount die, and the second capacitor die laterally spaced apart from the first capacitor die, wherein the second capacitor die is a second silicon-based capacitor die and is a second single-sided capacitor die; and
    a third capacitor die below the surface mount die, the third capacitor die entirely within the footprint of the surface mount die, and the third capacitor die laterally spaced apart from the second capacitor die, wherein the third capacitor die is a third silicon-based capacitor die and is a third single-sided capacitor die.

18. The package of claim 17, wherein the bridge die is laterally spaced apart from the first capacitor die.

19. The package of claim 17, wherein the first die is a processor die.

20. The package of claim 17, wherein the bridge die is an embedded interconnect bridge (EMIB) die.

* * * * *